(12) United States Patent
Choi et al.

(10) Patent No.: US 11,558,961 B2
(45) Date of Patent: Jan. 17, 2023

(54) PRINTED CIRCUIT BOARD

(71) Applicant: Samsung Electro-Mechanics Co., Ltd., Suwon-si (KR)

(72) Inventors: Jungwoo Choi, Suwon-si (KR); Tae-hong Min, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 394 days.

(21) Appl. No.: 16/662,094

(22) Filed: Oct. 24, 2019

(65) Prior Publication Data

US 2020/0383208 A1 Dec. 3, 2020

(30) Foreign Application Priority Data

May 29, 2019 (KR) .................. 10-2019-0063431

(51) Int. Cl.
| | |
|---|---|
| *H05K 1/18* | (2006.01) |
| *H05K 1/11* | (2006.01) |
| *H05K 3/36* | (2006.01) |
| *H05K 3/00* | (2006.01) |
| *H05K 3/46* | (2006.01) |
| *H05K 3/32* | (2006.01) |

(Continued)

(52) U.S. Cl.
CPC ............. *H05K 1/185* (2013.01); *H05K 1/115* (2013.01); *H05K 1/165* (2013.01); *H05K 3/0047* (2013.01); *H05K 3/32* (2013.01); *H05K 3/361* (2013.01); *H05K 3/4038* (2013.01); *H05K 3/4623* (2013.01); *H05K 1/0298* (2013.01); *H05K 1/18* (2013.01)

(58) Field of Classification Search
CPC ........ H05K 1/185; H05K 1/115; H05K 1/165; H05K 3/0047; H05K 3/32; H05K 3/361; H05K 3/4038; H05K 3/4623; H05K 1/0298; H05K 3/246; H05K 2201/10098; H05K 3/427; H05K 3/4069; H05K 3/4602; H05K 2201/09563; H05K 2201/096; H05K 3/429; H05K 3/108; H05K 2201/09536; H05K 1/116; H05K 3/42; H05K 2201/09372; H01Q 1/38
See application file for complete search history.

(56) References Cited

U.S. PATENT DOCUMENTS 5,338,900 A * 8/1994 Schneider ........... H01L 21/6835
174/250
6,376,052 B1 * 4/2002 Asai ..................... H05K 3/4602
428/209

(Continued)

FOREIGN PATENT DOCUMENTS

| JP | 2001-036210 A | | 2/2001 |
| JP | WO2004/068506 A | * | 8/2004 |
| JP | 2009-228124 A | | 10/2009 |

*Primary Examiner* — Ishwarbhai B Patel
(74) *Attorney, Agent, or Firm* — NSIP Law

(57) ABSTRACT

A printed circuit board includes a first insulating layer having a through hole, and a via disposed to fill the through hole and to be extended to at least one surface of the first insulating layer, wherein the via includes a plating layer having an inner wall part disposed on an inner wall of the through hole and a land part extended from the inner wall part and disposed on the at least one surface of the first insulating layer, and a metal paste layer including metal particles, and filled in the rest of the through hole and disposed on the plating layer.

11 Claims, 7 Drawing Sheets

(51) Int. Cl.
  *H05K 3/40* (2006.01)
  *H05K 1/16* (2006.01)
  *H05K 1/02* (2006.01)

(56) References Cited

U.S. PATENT DOCUMENTS

| | | | | |
|---|---|---|---|---|
| 6,515,237 | B2* | 2/2003 | Kikuchi | H05K 3/4069 |
| | | | | 174/255 |
| 9,236,274 | B1* | 1/2016 | Mobley | C03C 17/32 |
| 2004/0248410 | A1* | 12/2004 | Mok | H05K 3/28 |
| | | | | 438/689 |
| 2006/0145125 | A1* | 7/2006 | Kuwajima | H05K 1/095 |
| | | | | 252/500 |
| 2011/0094780 | A1* | 4/2011 | Uchibori | H05K 1/0265 |
| | | | | 174/258 |
| 2014/0338965 | A1* | 11/2014 | Kajihara | H05K 3/426 |
| | | | | 174/266 |
| 2015/0034378 | A1* | 2/2015 | Kajihara | H05K 3/427 |
| | | | | 174/266 |
| 2019/0322572 | A1* | 10/2019 | Mobley | H01L 21/486 |

* cited by examiner

PRINTED CIRCUIT BOARD

CROSS-REFERENCE TO RELATED APPLICATIONS

This application claims the benefit under 35 USC 119(a) of Korean Patent Application No. 10-2019-0063431 filed on May 29, 2019, in the Korean Intellectual Property Office, the entire disclosure of which is incorporated herein by reference for all purposes.

BACKGROUND

1. Field

This application relates to a printed circuit board and an antenna module board.

2. Description of the Background

In 5G communication, since a high frequency band of 20 GHz or more is adopted, smooth signal transmission becomes difficult with a printed circuit board having conventionally applied materials and structures.

Particularly, in a printed circuit board used in an antenna module that plays a role of reception and transmission of a high frequency signal, a core layer of a thick insulating material is required for securing a distance between the antenna part and the ground, and an inner via hole (IVH) or plated through hole (PTH) is also required to connect the top and bottom of the core layer.

However, the conventional via structure does not satisfy the electrical and mechanical characteristics required for such a printed circuit board, and has a high defect rate.

In JP 2009-228124, a method of filling through hole is disclosed.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a first insulating layer having a through hole, and a via disposed to fill the through hole and to be extended to at least one surface of the first insulating layer, wherein the via includes a plating layer having an inner wall part disposed on an inner wall of the through hole and a land part extended from the inner wall part and disposed on the at least one surface of the first insulating layer, and a metal paste layer formed of metal particles, and filled in the rest of the through hole and disposed on the plating layer.

The plating layer may be extended to both surfaces of the first insulating layer and further include a middle part extended from the inner wall part to block the through hole to divide the inner space of the through hole.

A land of the via may have the plating layer, the metal paste layer and the metal layer sequentially laminated.

The printed circuit board may further include a first circuit pattern disposed on the first insulating layer, wherein the first circuit pattern has the plating layer, the metal paste layer, and the metal layer sequentially laminated.

The land part in the plating layer may extended to one surface of the first insulating layer and the via may further include a land plating layer disposed on the other surface of the first insulating layer to cover the metal paste layer.

The metal paste layer may protrude on the land part on the one surface of the first insulating layer and may be embedded by the land plating layer on the other surface of the first insulating layer.

The printed circuit board may further include a second insulating layer disposed on the first insulating layer and embedding the via, and a second circuit pattern disposed on the second insulating layer.

The printed circuit board may further include an antenna disposed on a first surface of the at least one surface and connected by the via to an electronic component disposed on a second surface of the at least one surface opposite to the first surface.

In another general aspect, an antenna module board includes a printed circuit board having a first insulating layer including a through hole from a first surface to a second surface opposite the first surface, a conductor plating disposed on a surface of the through hole and one or more of the first surface and the second surface, and a conductor metal paste having metal particles and disposed on the conductor plating in the through hole and on the one or more of the first surface and the second surface, and an antenna disposed on the first surface connected by the conductor plating and conductor metal paste to an electronic component disposed on the second surface.

The conductor plating disposed on a surface of the through hole may have a middle part dividing an inner space from the first surface to the second surface into two cavities, and the conductor metal paste may fill the two cavities.

The conductor plating disposed on a surface of the through hole may have an inner space from the first surface to the second surface, and the conductor metal paste may fill the space.

The conductor plating may be disposed on one of the first surface and the second surface and a land plating layer may be disposed on the other of the first surface and the second surface to cover the metal paste layer.

The antenna module board may further include a metal layer disposed on a flat surface of the conductor metal paste disposed on the conductor plating on the one or more of the first surface and the second surface.

The antenna module board may further include a first circuit pattern formed on the first insulating layer, wherein the first circuit pattern may include the conductor plating, the conductor metal paste and the metal layer sequentially laminated.

The antenna module board may further include a second insulating layer disposed on the first insulating layer and embedding the conductor plating, the conductor metal paste, and the metal layer, and a second circuit pattern disposed on the second insulating layer and connected to the antenna.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
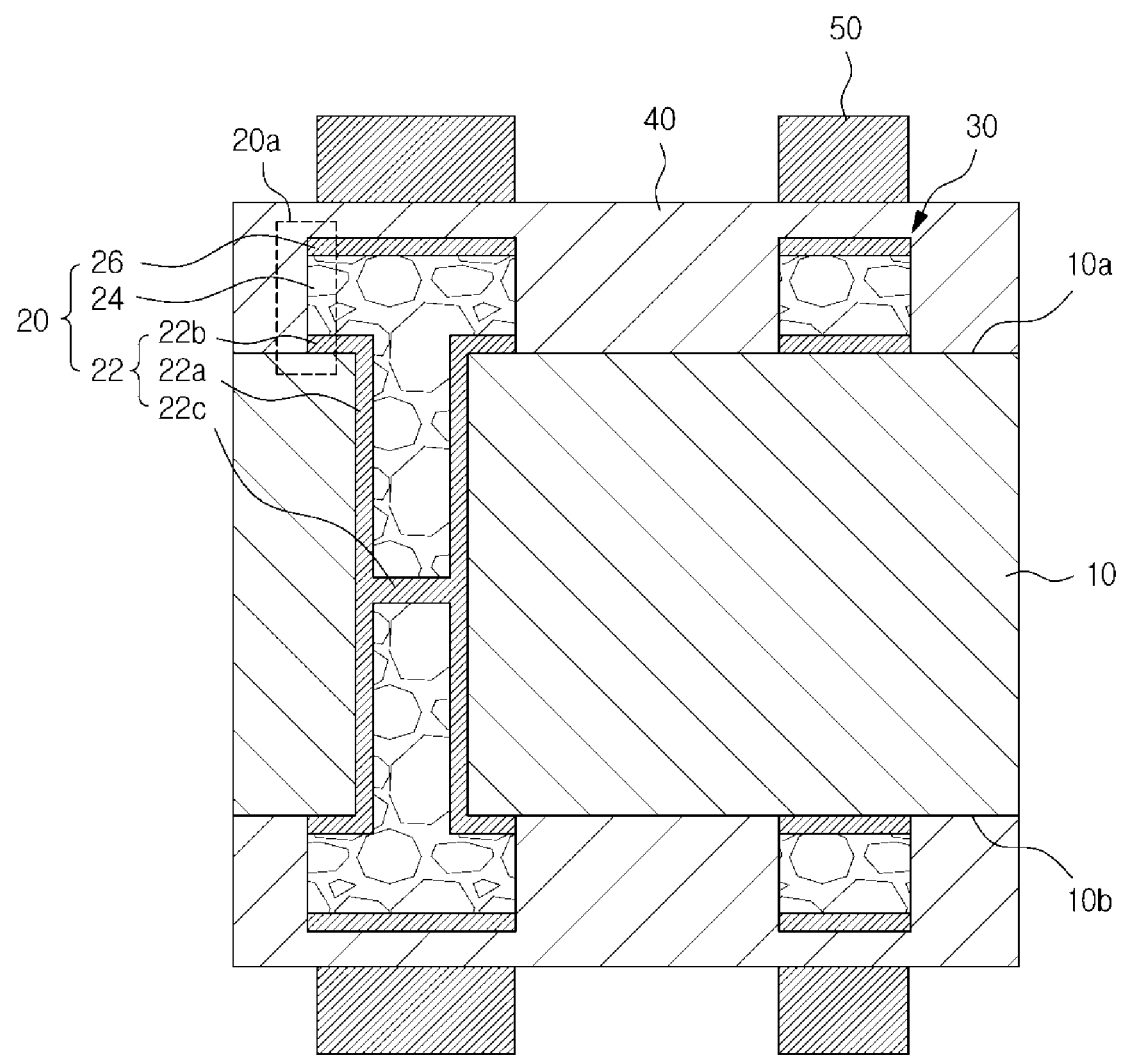
FIG. 1 is a diagram illustrating a printed circuit board according to one or more examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

The examples herein describe a printed circuit board having a via that has excellent electrical characteristics such as excellent signal transmission and can correspond to a thick insulating layer and an antenna module board including a printed circuit board.

Hereinafter, various embodiments of the printed circuit board will be described separately, but this does not exclude the description of any one embodiment being applied to other embodiments. The description of any one embodiment may be applied to other embodiments as long as the relationship is not incompatible.

FIG. 1 is a diagram illustrating a printed circuit board according to one or more examples.

Referring to FIG. 1, a printed circuit board may include a first insulating layer 10 and a via 20, wherein the via 20 may include a plating layer 22 and a metal paste layer 24.

The first insulating layer 10 may electrically insulate a circuit pattern formed on an inner or outer layer thereof. The first insulating layer 10 may be a resin material. The first insulating layer 10 may include a thermosetting resin such as an epoxy resin or a thermoplastic resin such as polyimide (PI), and may be formed of a prepreg (PPG) or a build-up film.

Referring to FIG. 1, a through hole 12 (see FIG. 2) that is opened to both surfaces may be formed in the first insulating layer 10. A conductive via 20 may be filled in the through hole 12 to electrically connect circuit patterns formed on both surfaces of the first insulating layer 10.

The via 20 may electrically connect the circuit patterns formed on both surfaces of the first insulating layer 10 as part of the circuit patterns. The via 20 has a structure that fills the through hole 12 of the first insulating layer 10 and extends to at least one surface of the first insulating layer 10.

The circuit pattern may be formed of a metal, such as copper, to which an electrical signal can be transmitted. The circuit pattern may also be formed on one surface 10a, the other surface 10b, or an inner surface of the first insulating layer 10. For example, the circuit pattern may include the via 20 passing through the first insulating layer 10 and a pad formed on the one surface 10a or the other surface of the first insulating layer 10 and connected to the via 20.

In the present example, the via 20 has a structure including the plating layer 22 and the metal paste layer 24.

The plating layer 22 may have a structure formed on an inner wall of the through hole 12 and on the surface of the first insulating layer 10 and may form a base layer in contact with the first insulating layer 10 in the via 20. The plating layer 22 may have an inner wall part 22a formed on the inner wall of the through hole 12 and a land part 22b formed on one surface 10a of the first insulating layer 10 extended from the inner wall part 22a.

Referring to FIG. 1, the via 20 of the present example may have a via land 20a whose end portion has a diameter larger than that of the through hole 12. Here, the plating layer 22 may include the land part 22b extended outward from the inner wall of the through hole 12 and thus extended laterally on the first insulating layer 10. Here, the plating layer 22 may be formed by plating a metal such as copper on the first insulating layer 10.

The metal paste layer 24 is formed on the plating layer 22 so as to fill the remaining portion where the plating layer 22 is formed in the through hole 12 and is added on the plating layer 22 constituting the base layer to form the via 20. The metal paste layer 24, including metal particles, may have conductivity to transmit an electrical signal. Thus, both electrical conductivity and thermal conductivity of the via 20 are excellent, compared with vias that form plugs with conventional insulating materials. In addition, since the via 20 is excellent in terms of stress dispersion with respect to heat and external force, the via 20 can be greatly advantageous in terms of reliability when used in a multi-layer substrate. The metal paste may include a resin as a base material and metal particles such as silver, copper, gold, tin and the like, which have excellent conductivity and low resistance.

Referring to FIG. 1, when the plating layer 22 forms the outer wall of the via 20 in the through hole 12, the via 20 may be formed by filling the metal paste layer 24 in the through hole on the inner wall part 22a of the plating layer 22. The metal paste layer 24 may also be laminated on the first insulating layer 10 having a predetermined thickness and on the land part 22b of the plating layer 22.

For example, the plating layer 22 in the via 20 of the present example may be extended to both surfaces 10a, 10b of the first insulating layer 10. Via lands 20a including the plating layer 22 and the metal paste layer 24 may be formed on both sides of the via 20. Here, the plating layer 22 may include a middle part 22c that divides the space of the through hole 12.

Referring to FIG. 1, the middle part 22c may have a structure that extends from the inner wall part 22a and blocks the through hole 12. That is, the middle part 22c may be formed in the form of a partition wall that crosses the inner wall part 22a. Accordingly, the inner space of the through hole 12 may be divided by the middle part 22c. The metal paste layer 24 may be separated based on the middle part 22c. The metal paste layer 24 laminated on one surface 10a of the first insulating layer 10 and the metal paste layer 24 laminated on the other surface 10b of the first insulating layer 10 may be separated upward and downward based on the middle part 22c formed in the middle portion of the via 20.

The via 20 of the present example may further include a metal layer 26 formed on the surface of the metal paste layer 24. Here, the metal layer 26 may be formed by plating. The plating layer 22 is formed on the lower surface of the metal paste layer 24 and the metal layer 26 is formed on the upper surface of the metal paste layer 24 so that the insufficient adhesion of the metal paste layer 24 to the insulating material may be compensated.

Figure 10:
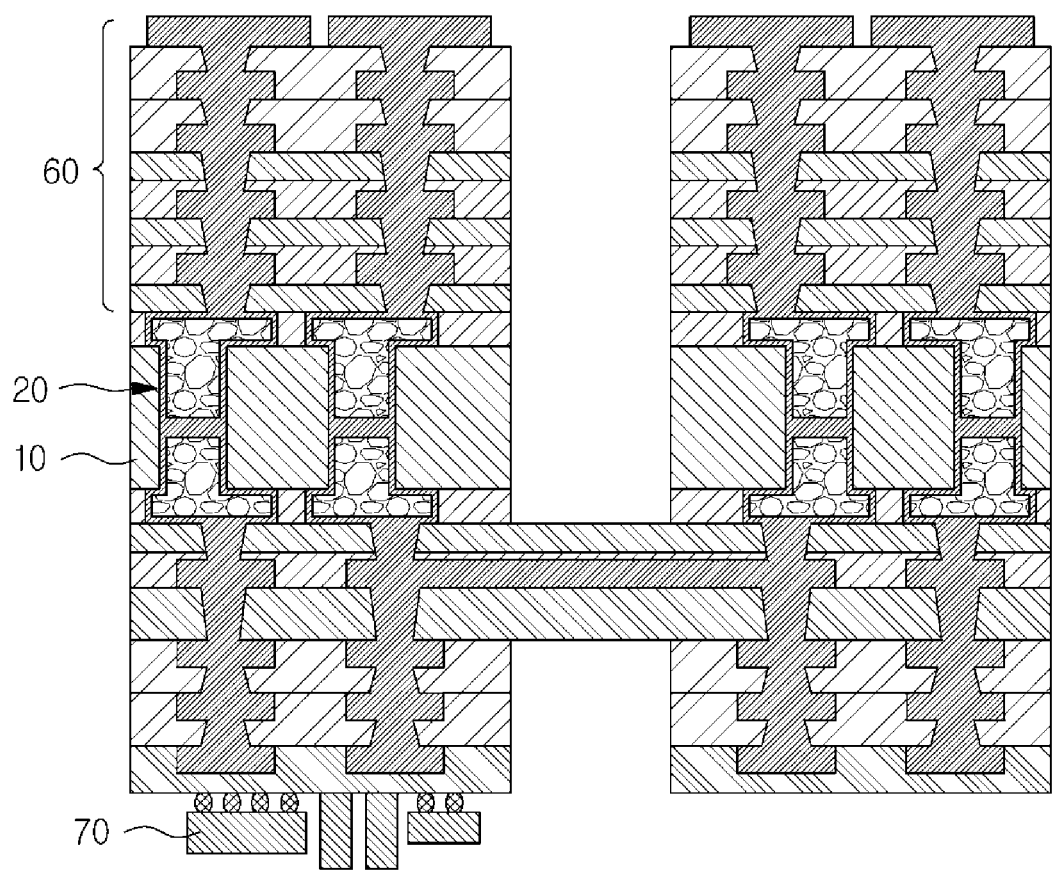
FIG. 10 is a diagram illustrating an application of a printed circuit board according to one or more examples.

Further, since the electric signal mostly flows along the outer surface of the via 20, the plating layer 22 and the metal layer 26 may complement the insufficient electrical conductivity of the metal paste layer 24. For example, the plating layer 22 may be formed of copper and the metal layer 26 may be formed of gold or silver to enhance signal transmission. On the other hand, the plating layer 22 or the metal layer 26 may be formed to cover a side surface of the metal paste layer 24 (FIG. 10).

Referring to FIG. 1, the metal paste layer 24 formed on the first insulating layer 10 may have a flat surface, and the metal layer 26 may be formed on the metal paste layer 24. Accordingly, the via land 20a may have a structure in which the plating layer 22, the metal paste layer 24, and the metal layer 26 are sequentially laminated.

The printed circuit board may further include a first circuit pattern 30 on the first insulating layer 10 and the first circuit pattern 30 may be formed in a structure similar to the via 20. The first circuit pattern 30 may have a structure in which the metal paste layer 24 is laminated on the plating layer 22 as a base layer and the metal layer 26 is further laminated on the metal paste layer 24.

A second insulating layer 40 may be laminated on the first insulating layer 10 and the via 20 may be buried by the second insulating layer 40. A second circuit pattern 50 may be formed on the second insulating layer 40.

Referring to FIG. 1, the second insulating layer 40 may be laminated on the first insulating layer 10 to bury the via 20 and the first circuit pattern 30. Also, the second circuit pattern 50 may be formed on the second insulating layer 40.

Hereinafter, a method of manufacturing a printed circuit board according to one or more examples will be described. FIG. 2 to FIG. 9 are diagrams illustrating a method for manufacturing a printed circuit board according to one or more examples.

Figure 2:
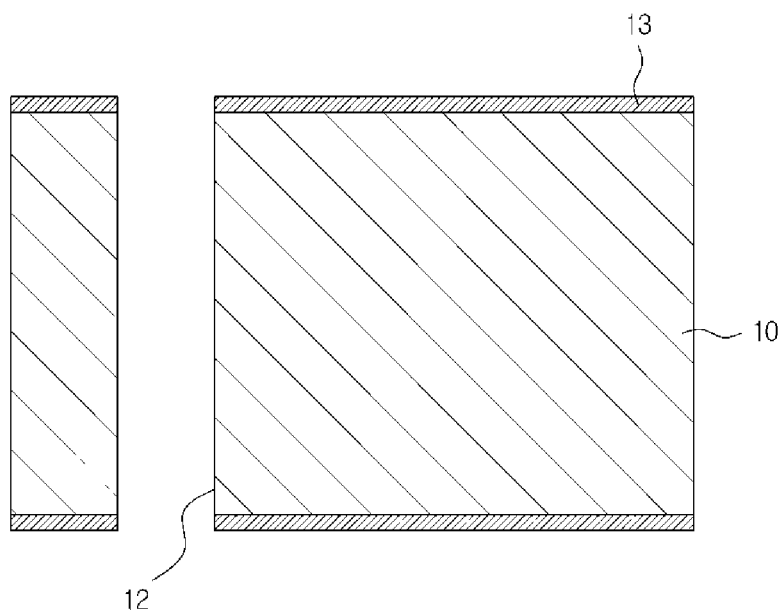
FIG. 2, FIG. 3, FIG. 4, FIG. 5, FIG. 6, FIG. 7, FIG. 8, and FIG. 9 are diagrams illustrating a method for manufacturing a printed circuit board according to one or more examples.

Referring to FIG. 2, a first insulating layer 10 having a through hole 12 may be provided by preparing a copper-clad laminate in which a copper foil 13 is formed on both surfaces of an insulating material and forming the through hole 12 therein.

Figure 3:
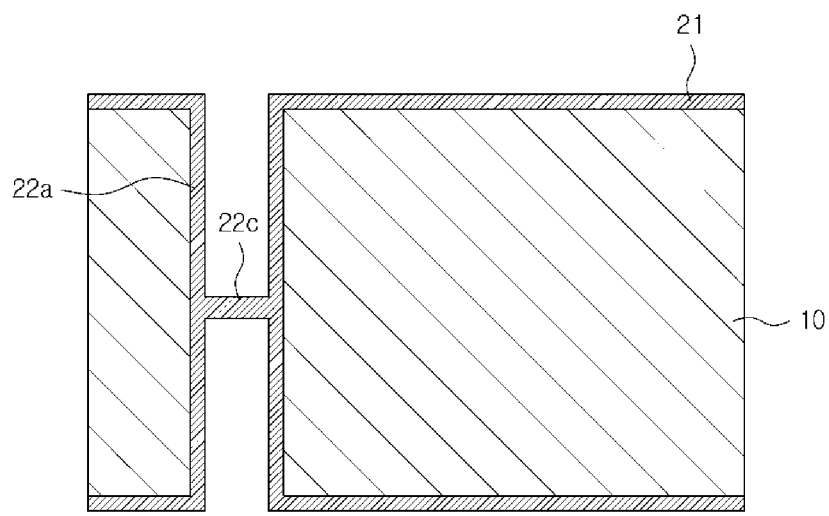

Referring to FIG. 3, a plating layer 21 may be formed on an inner wall of the through hole 12 and the copper foil through plating. The plating layer 21 may include a middle part 22c connected to the inner wall part 22a so as to divide the space of the through hole 12. For example, the middle part 22c may be formed to block a part of the inner space of the through hole 12 by a periodic pulse reverse plating (PPR) method.

Figure 4:
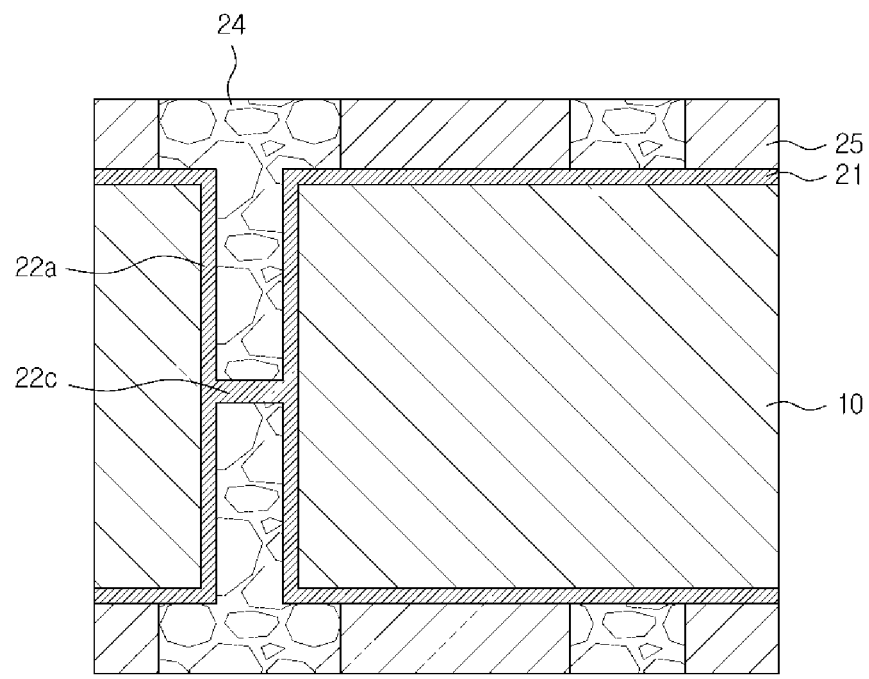

Referring to FIG. 4, a resist layer 25, selectively exposing the plating layer 21 formed on the through hole 12, may be formed and the metal paste layer 24 may be formed by laminating a metal paste on the exposed plating layer 22. For example, since the inner space of the through hole 12 may be divided by the middle part 22c of the plating layer 22, the metal paste may be filled in the via 20 divided into upper and lower portions. Accordingly, even in the case of the deep via 20 formed in the thick first insulating layer 10, the metal paste may be stably filled in the via 20 without leaving any void. The through hole 12 may be filled with the metal paste by a vacuum printing using pressure difference. Here, the middle part 22c of the plating layer 22 may serve as a cap to enable the vacuum printing.

Since the open region of the resist layer 25 exposes the plating layer 21 to the region corresponding to the via land 20a, the metal paste layer 24 may also be formed on the portion to be the land part 22b in the plating layer 22. The open region of the resist layer 25 may also be formed on the portion where the first circuit pattern 30 is to be formed, so that the metal paste layer 24 may be formed. Therefore, the formation of the first circuit pattern 30 may also be performed simultaneously with the formation of the via 20, thereby reducing the manufacturing process and cost.

Figure 5:
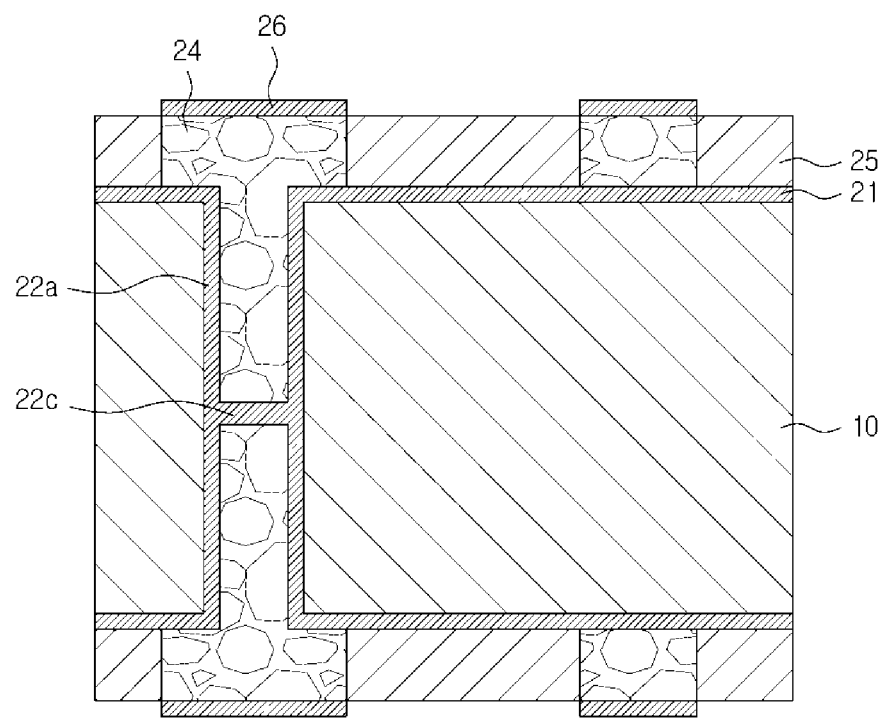

Referring to FIG. 5, the metal paste layer 24 has a flat surface and a metal layer 26 may be additionally formed on the metal paste layer 24 by plating.

Figure 6:
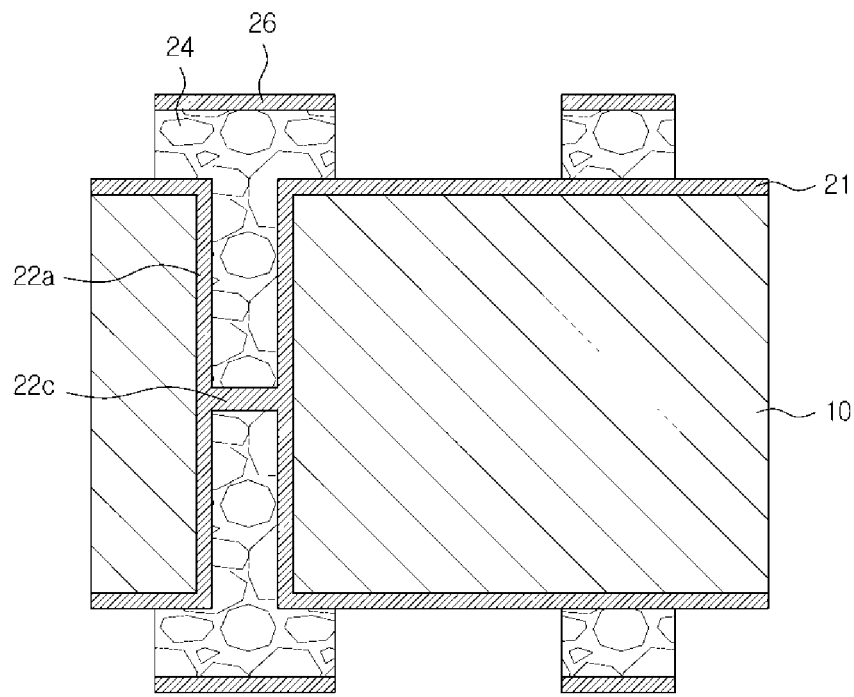
Figure 7:
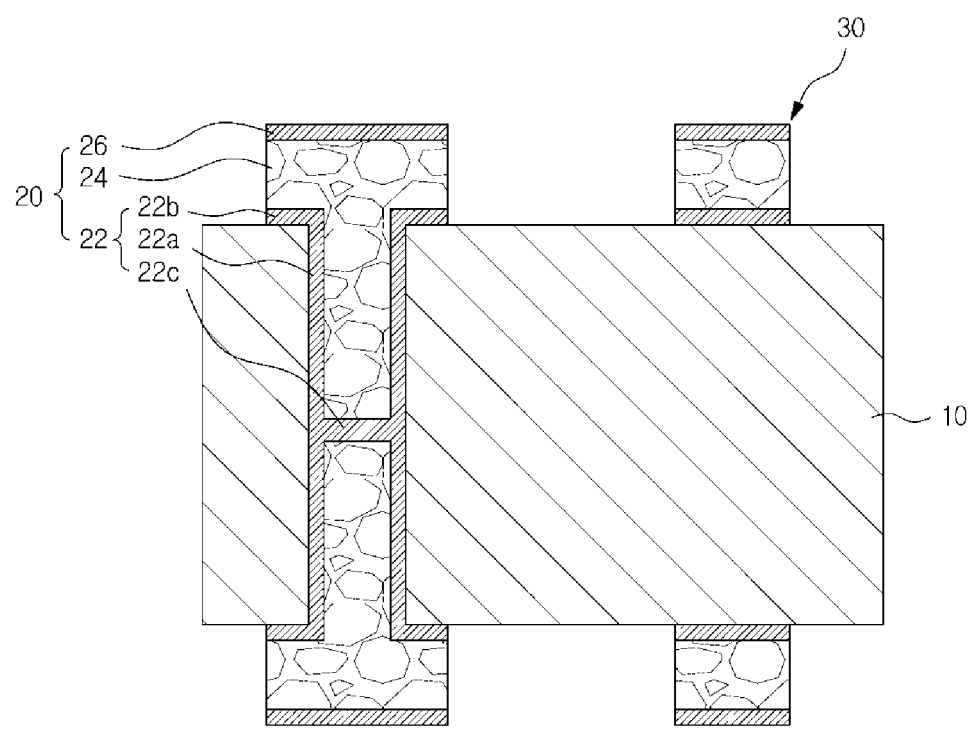

Referring to FIG. 6 and FIG. 7, after removing the resist layer, the exposed plating layer 21 may be removed by etching and the via 20 and the first circuit pattern 30 may be formed separately.

Figure 8:
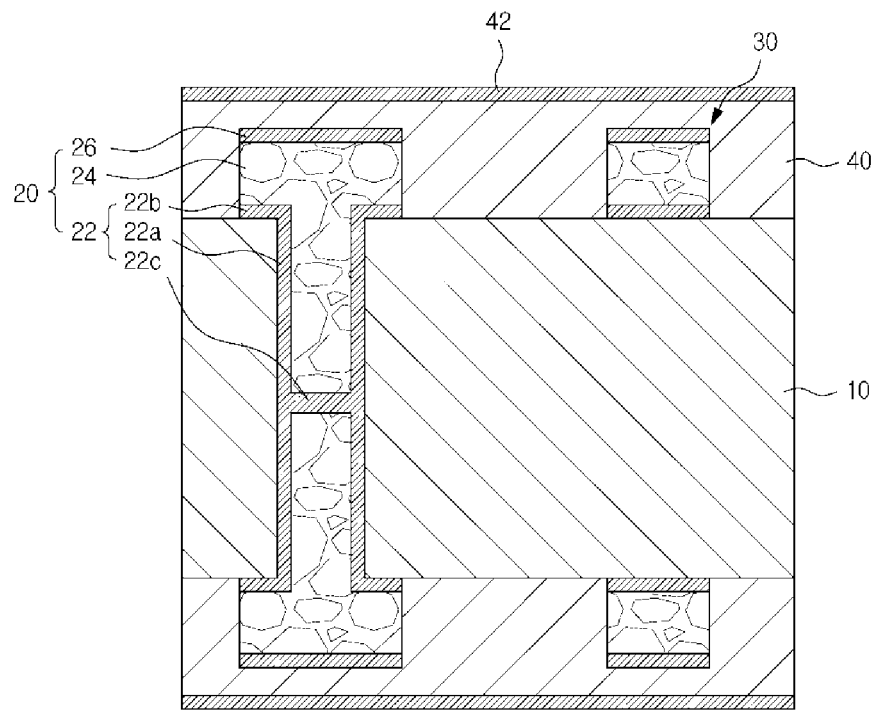
Figure 9:
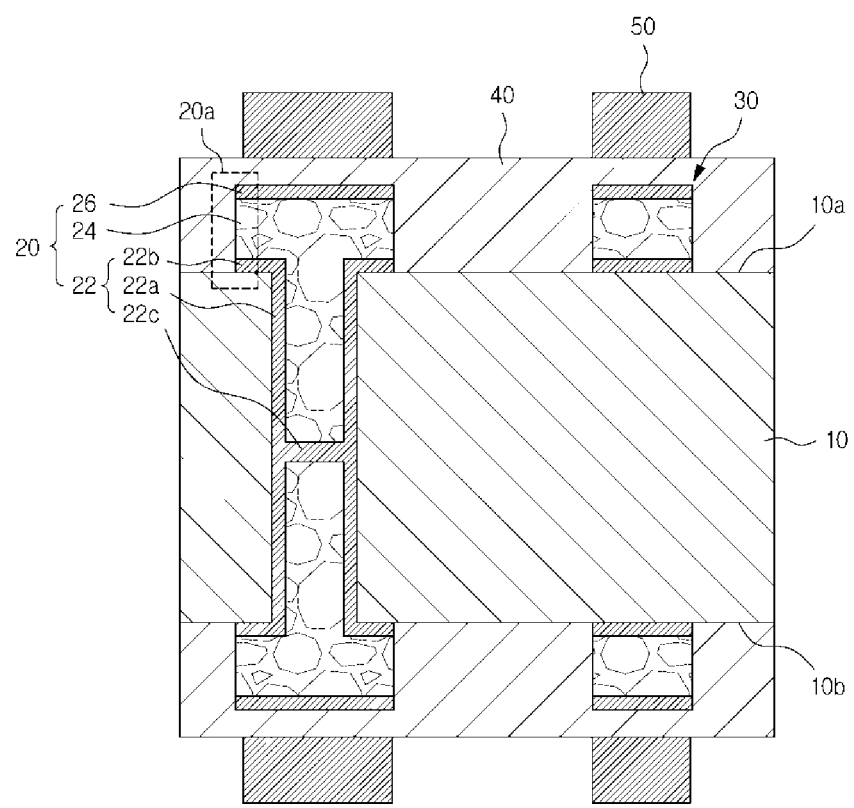

Referring to FIG. 8 and FIG. 9, the second insulating layer 40 may be laminated on the first insulating layer 10 to bury the via 20 and the first circuit pattern 30. For example, a copper clad laminate may become the second insulating layer 40 by laminating a copper clad laminate having a copper foil 42 on one surface of the first insulating layer 10 and may form a second circuit pattern 50 using the copper foil 42.

The first insulating layer 10 may be laminated with the copper foil laminated board having the copper foil 42 on one surface so that the insulating material of the copper clad laminate becomes the second insulating layer 40, and the copper foil 42 can be patterned to form the second circuit pattern 50.

FIG. 10 is a diagram illustrating an application of a printed circuit board according to one or more examples.

Referring to FIG. 10, a printed circuit board may be used as an antenna module board requiring a thick core. A first insulating layer 10 may be formed as a thick core layer, and via 20 may pass through the core layer to connect electrical signals. Since a reliable through hole via is required in the thick core layer in the antenna module board, the printed circuit board of the examples described herein may be usefully applied therefor. For example, the via 20 made of the plating layer 22 and the metal paste layer 24 of the examples described herein may be formed on the core layer having a thickness of 200 microns ($\mu$m) or more.

Additional circuit pattern 60 may be disposed on the one side 10a of the first insulating layer 10. The additional circuit pattern 60 may include one or more of a wire, via, transistor, capacitor, dipole antenna, patch antenna, monopole antenna, loop antenna, etc., and the like. An electronic device 70 may be disposed on the other side 10b of the first insulating layer 10. The electronic device 70 may refer to an electronic component such as an integrated chip (IC), an active element, or a passive element.

In addition, since the metal paste has better bending property (flexibility) than plating having the same thickness, the structure of the examples described herein may be applied to a flexible substrate.

Figure 11:
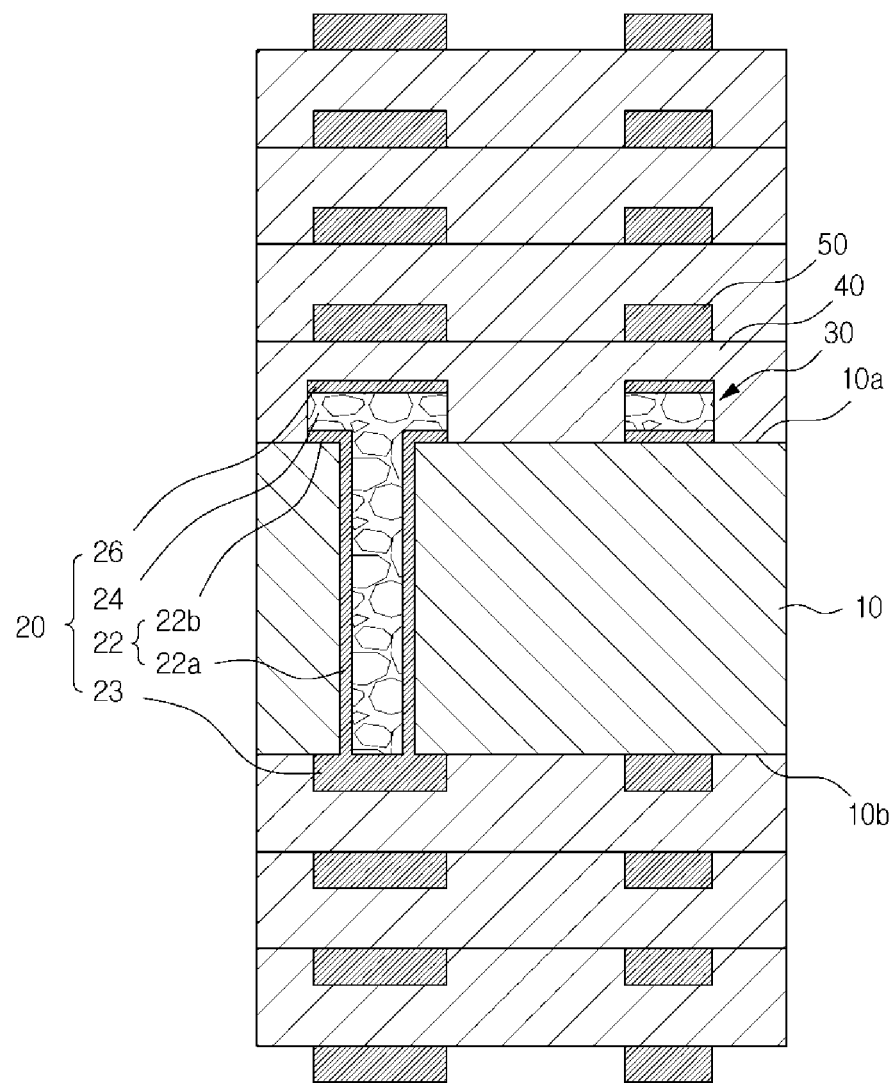
FIG. 11 is a diagram illustrating a printed circuit board according to another one or more examples.

FIG. 11 is a diagram illustrating a printed circuit board according to another one or more examples.

A printed circuit board according to the present examples differs from the above-described examples in a structure of a via 20'. For example, there is no middle part 22c in a plating layer 22 of the via 20', and the via 20' further includes a land plating layer 23.

Referring to FIG. 11, the land part 22b of the plating layer 22 may be formed so as to extend only to one surface 10a of a first insulating layer 10. The land part 22b may not be formed on the other surface 10b of the first insulating layer 10. The metal paste layer 24 may be filled in the through hole 12 and laminated on the land part 22b on one surface 10a of the first insulating layer 10 but not on the other surface 10b of the first insulating layer 10. Here, the land plating layer 23 covering the metal paste layer 24 may be formed on the other surface 10b of the first insulating layer 10.

The metal paste layer 24 may be formed on the land part 22b on one surface 10a of the first insulating layer 10 to be protruded from the first insulating layer 10. The metal paste layer 24 may be buried by the land plating layer 23 on the other surface 10b of the layer 10 so as not to be protruded therefrom.

Here, the land plating layer 23 may be formed only of the plating pattern to be thicker than the plating layer 22 of the via 20. The land plating layer 23 may be formed by a plating process different from the plating layer 22 of the via 20.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a first insulating layer comprising a through hole;
   a via, disposed to fill the through hole and to be extended to at least one surface of the first insulating layer, the via comprising:
     a plating layer comprising an inner wall part disposed on an inner wall of the through hole and a land part extended from the inner wall part and disposed on the at least one surface of the first insulating layer;
     a metal paste layer comprising metal particles, and filled in the rest of the through hole and disposed on the plating layer and an upper surface of the land part; and
     a metal layer disposed on an upper surface of the metal paste layer; and
   a first circuit pattern, disposed on the first insulating layer, comprising the metal paste layer.

2. The printed circuit board of claim 1, wherein the metal paste layer disposed on the first insulating layer comprises a flat surface, and the metal layer disposed thereon.

3. The printed circuit board of claim 2, wherein a land of the via comprises the plating layer, the metal paste layer and the metal layer sequentially laminated.

4. The printed circuit board of claim 3, wherein the first circuit pattern further comprises the plating layer, and the metal layer, and
wherein the plating layer, the metal paste layer, and the metal layer of the first circuit pattern are sequentially laminated.

5. The printed circuit board of claim 1, wherein the land part in the plating layer is extended to one surface of the first insulating layer and the via further comprises a land plating layer disposed on the other surface of the first insulating layer to cover the metal paste layer.

6. The printed circuit board of claim 5, wherein the metal paste layer protrudes on the land part on the one surface of the first insulating layer and is embedded by the land plating layer on the other surface of the first insulating layer.

7. The printed circuit board of claim 1, further comprising a second insulating layer disposed on the first insulating layer and embedding the via; and
a second circuit pattern disposed on the second insulating layer.

8. The printed circuit board of claim 1, further comprising an antenna disposed on a first surface of the at least one surface and connected by the via to an electronic component disposed on a second surface of the at least one surface opposite to the first surface.

9. The printed circuit board of claim 1, wherein the land part comprises a first land part extending in a first direction on the at least one surface of the first insulating layer and a second land part extending in a second direction, different from the first direction, on the at least one surface of the first insulating layer.

10. The printed circuit board of claim 9, wherein the metal layer extends over the first land part and the second land part.

11. A printed circuit board comprising:
a first insulating layer comprising a through hole;
a via, disposed to fill the through hole and to be extended to at least one surface of the first insulating layer, the via comprising;
a plating layer comprising an inner wall part disposed on an inner wall of the through hole and a land part extended from the inner wall part and disposed on the at least one surface of the first insulating layer;
a metal paste layer comprising metal particles, and filled in the rest of the through hole and disposed on the plating layer and an upper surface of the land part; and
a metal layer disposed on an upper surface of the metal paste layer,
wherein the plating layer is extended to both surfaces of the first insulating layer and further comprises a middle part extended from the inner wall part to block the through hole to divide the inner space of the through hole.

\* \* \* \* \*